(12) United States Patent
Kim et al.

(10) Patent No.: US 10,115,806 B2
(45) Date of Patent: Oct. 30, 2018

(54) SEMICONDUCTOR DEVICES

(71) Applicant: SAMSUNG ELECTRONICS CO., LTD., Suwon-si, Gyeonggi-do (KR)

(72) Inventors: Chang-Hwa Kim, Hwaseong-si (KR); Joon-Gon Lee, Seoul (KR); Inchan Hwang, Siheung-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/165,016

(22) Filed: May 26, 2016

(65) Prior Publication Data

US 2017/0033048 A1 Feb. 2, 2017

(30) Foreign Application Priority Data

Jul. 31, 2015 (KR) ........................ 10-2015-0108473

(51) Int. Cl.
| *H01L 21/70*  | (2006.01) |
| *H01L 29/66*  | (2006.01) |
| *H01L 29/78*  | (2006.01) |
| *H01L 21/768* | (2006.01) |
| *H01L 23/485* | (2006.01) |

(Continued)

(52) U.S. Cl.
CPC .. *H01L 29/66636* (2013.01); *H01L 21/76805* (2013.01); *H01L 21/76816* (2013.01); *H01L 21/76843* (2013.01); *H01L 21/76895* (2013.01); *H01L 23/485* (2013.01); *H01L 29/66795* (2013.01); *H01L 29/7851* (2013.01); *H01L 23/5226* (2013.01); *H01L 23/53223* (2013.01); *H01L 23/53238* (2013.01); *H01L 23/53266* (2013.01); *H01L 23/53295* (2013.01)

(58) Field of Classification Search
CPC ......... H01L 29/41791; H01L 29/41758; H01L 29/66636; H01L 23/485; H01L 29/7851; H01L 29/66795; H01L 21/76843; H01L 21/76816; H01L 21/76895; H01L 21/76805; H01L 23/53295; H01L 23/53238; H01L 23/53223; H01L 23/5226; H01L 23/53266

See application file for complete search history.

(56) References Cited

U.S. PATENT DOCUMENTS

| 6,177,342 B1 | 1/2001 | Lee et al. |
| 7,160,803 B2 | 1/2007 | Kim et al. |

(Continued)

FOREIGN PATENT DOCUMENTS

| KR | 1998-0033882 A | 8/1998 |
| KR | 1998-0054475 A | 9/1998 |

(Continued)

*Primary Examiner* — Victor A Mandala
(74) *Attorney, Agent, or Firm* — Lee & Morse, P.C.

(57) ABSTRACT

A semiconductor device includes a substrate with lower structures, an insulation layer covering the lower structures on the substrate, a contact hole through the insulation layer partially exposing the substrate, and a contact structure contacting the substrate through the contact hole, the contact structure including a barrier pattern having an upper barrier on an upper portion of a sidewall of the contact hole, and a lower barrier filling a lower portion of the contact hole, and a conductive contact pattern filling an upper portion of the contact hole defined by the upper barrier and the lower barrier.

11 Claims, 12 Drawing Sheets

(51) Int. Cl.
  *H01L 23/532* (2006.01)
  *H01L 23/522* (2006.01)

(56) References Cited

U.S. PATENT DOCUMENTS

| | | |
|---|---|---|
| 7,595,263 B2 | 9/2009 | Chung et al. |
| 7,777,346 B2 | 8/2010 | Ishikawa et al. |
| 8,120,119 B2 | 2/2012 | Fischer et al. |
| 2002/0064946 A1 | 5/2002 | Wasshuber |
| 2005/0023702 A1* | 2/2005 | Nishimura ........ H01L 21/28556 257/774 |
| 2008/0157208 A1* | 7/2008 | Fischer ............. H01L 21/76843 257/368 |
| 2008/0217775 A1* | 9/2008 | Pai .................... H01L 21/76877 257/751 |
| 2012/0043592 A1* | 2/2012 | Zhao ................. H01L 21/76847 257/288 |
| 2012/0211807 A1* | 8/2012 | Yu ..................... H01L 29/41791 257/288 |
| 2013/0256767 A1* | 10/2013 | Pradhan .................. H01L 29/78 257/288 |
| 2014/0273379 A1* | 9/2014 | Tsai .................. H01L 29/66795 438/283 |
| 2014/0327056 A1* | 11/2014 | Park ........................ H01L 29/78 257/288 |
| 2015/0041854 A1* | 2/2015 | Wang ................. H01L 29/0653 257/190 |
| 2016/0141423 A1* | 5/2016 | Diaz ................ H01L 29/78618 257/329 |
| 2016/0308008 A1* | 10/2016 | Yeo ....................... H01L 29/408 |

FOREIGN PATENT DOCUMENTS

| | | |
|---|---|---|
| KR | 10-2003-0058230 A | 7/2003 |
| KR | 10-0458297 B1 | 11/2004 |
| KR | 10-2005-0059792 A | 6/2005 |
| KR | 10-2007-0095012 A | 9/2007 |

* cited by examiner

SEMICONDUCTOR DEVICES

CROSS-REFERENCE TO RELATED APPLICATION

Korean Patent Application No. 10-2015-0108473, filed on Jul. 31, 2015, in the Korean Intellectual Property Office, and entitled: "Semiconductor Devices," is incorporated by reference herein in its entirety.

BACKGROUND

1. Field

Example embodiments relate to semiconductor devices, and more particularly, to fin type field effect transistors (finFET).

2. Description of the Related Art

As recent memory devices have been highly integrated and downsized, the size of active regions has been also reduced in a semiconductor substrate. Thus, the gate resistance and the threshold voltage in such reduced active regions tend to increase due to the decrease of the gate width and the channel length in cell transistors. Particularly, the decrease of the channel length in a MOSFET usually causes the deterioration of gate channel characteristics, i.e., causes a short channel effect. For those reasons, a finFET, in which a gate electrode protrudes into a fin shape to expand the channel, has been most widely used to prevent or minimize the short channel effect and the current leakage in spite of the size reduction of semiconductor devices.

SUMMARY

Example embodiments provide semiconductor devices having contact structures that include lower portions with metal barriers.

According to exemplary embodiments, there is provided semiconductor devices including a substrate with lower structures, an insulation layer covering the lower structures on the substrate, a contact hole through the insulation layer partially exposing the substrate, and a contact structure contacting the substrate through the contact hole, the contact structure including a barrier pattern having an upper barrier on an upper portion of a sidewall of the contact hole, and a lower barrier filling a lower portion of the contact hole, and a conductive contact pattern filling an upper portion of the contact hole defined by the upper barrier and the lower barrier such that a volume of the conductive contact pattern may be smaller than a volume of the barrier pattern in the contact hole.

In example embodiments, the barrier pattern may include at least one of a barrier metal and a metal nitride and the contact pattern may include a conductive metal.

In example embodiments, barrier pattern may include at least one material selected from the group consisting of tantalum (Ta), titanium (Ti), molybdenum (Mo), ruthenium (Ru), cobalt (Co), tungsten (W), titanium nitride (TiN), tantalum nitride (TaN), tungsten nitride (WN) and combinations thereof and the contact pattern may include at least one material selected from the group consisting of tantalum (Ta), titanium (Ti), molybdenum (Mo), ruthenium (Ru), cobalt (Co), tungsten (W) and combinations thereof.

In example embodiments, the contact pattern may include a crystal nucleus metal pattern experiencing a nucleation process.

In example embodiments, the contact pattern may include a PVD pattern that may be formed on the barrier pattern by a physical vapor deposition (PVD) process and a CVD pattern that may be formed on the PVD pattern by a chemical vapor deposition (CVD) process.

In example embodiments, the PVD pattern may have a thickness corresponding to a lower width of the contact structure.

In example embodiments, the upper barrier may have a thickness of 0.5 nm to 2 nm and the lower barrier has a height of ½ to ⅔ times a height of the contact structure.

In example embodiments, the lower barrier may have a height of 20 nm to 50 nm and the contact pattern has a height of 40 nm to 70 nm.

In example embodiments, the contact structure may be shaped into a reverse trapezoidal shape having an upper width greater than a lower width.

In example embodiments, the lower width may be in a range of 5 nm to 10 nm and the upper width is in a range of 14 nm to 20 nm.

According to exemplary embodiments, there is provided other semiconductor devices including at least an active fin extending in a first direction on a semiconductor substrate, at least a gate line crossing the active fin in a second direction, semiconductor junctions on the active fin around the gate line, an insulation interlayer pattern covering the gate line and having at least a contact hole through which at least a portion of the semiconductor junction may be exposed, and a contact structure making contact with the semiconductor junction in the contact hole in such a configuration that the contact structure may include a barrier pattern having an upper barrier on an upper portion of a sidewall of the contact hole and a lower barrier filling a lower portion of the contact hole and a conductive contact pattern filling an upper portion of the contact hole that may be defined by the sidewall barrier and the lower barrier. A volume of the conductive contact pattern may be smaller than a volume of the barrier pattern in the contact hole.

In example embodiments, the semiconductor substrate may include a silicon-on-insulator (SOI) substrate having a base body, a substrate insulator on the base body and a semiconductor layer on the substrate insulator.

In example embodiments, the gate line may include a gate insulation pattern extending in the second direction and covering top and side surfaces of the active fin and a surface of the substrate between the neighboring active fins, a gate conductive pattern arranged on the gate insulation pattern and having a thickness to fill a gap space between the neighboring active fins and a gate capping pattern arranged on the gate conductive pattern and having an upper surface coplanar with an upper surface of the insulation interlayer pattern.

In example embodiments, the gate line may have a line width of 5 nm to 10 nm.

In example embodiments, the lower barrier may have a height of ½ to ⅔ times a height of the contact structure.

In example embodiments, the height of the lower barrier may be in a range of 20 nm to 50 nm and the contact pattern may have a height of 40 nm to 70 nm.

In example embodiments, the contact structure may be shaped into a reverse trapezoidal shape having an upper width of 14 nm to 20 nm and a lower width of 5 nm to 10 nm.

In example embodiments, the barrier pattern may include a metal nitride and the contact pattern may include a conductive metal.

In example embodiments, the contact pattern may include a crystal nucleus tungsten (W) pattern experiencing a nucleation process.

In example embodiments, the contact pattern includes a first cobalt pattern on the barrier pattern, and a second cobalt pattern on the first cobalt pattern, the first cobalt pattern exhibiting higher adhesion to the barrier pattern than the second cobalt pattern.

According to exemplary embodiments, there is provided still other semiconductor devices including a substrate with lower structures, an insulation layer covering the lower structures on the substrate, a contact hole through the insulation layer partially exposing the substrate, and a contact structure contacting the substrate through the contact hole, the contact structure including a lower barrier completely filling a lower portion of the contact hole, an upper barrier extending from the lower barrier along a sidewall of the contact hole to define an opening above the lower barrier, and a conductive contact pattern filling the opening such that a volume of the conductive contact pattern may be smaller than volumes of the upper barrier and the lower barrier in the contact hole.

In example embodiments, the lower barrier and the sidewall barrier may consist of a same material and are integral with each other, the lower barrier and the sidewall barrier define a seamless structure exhibiting higher gap-fill characteristics than a material of the conductive pattern.

In example embodiments, an aspect ratio of the contact hole may be about 1:8 to about 1:20, and the lower barrier may have a height of about ½ to ⅔ times a height of the contact structure.

In example embodiments, the contact structure may have a reverse trapezoidal shape, the lower barrier completely filling a portion of the reverse trapezoidal shape including a smaller width of the reverse trapezoidal shape.

In example embodiments, a height of the conductive contact pattern may be about ½ or less of a height of the contact hole.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
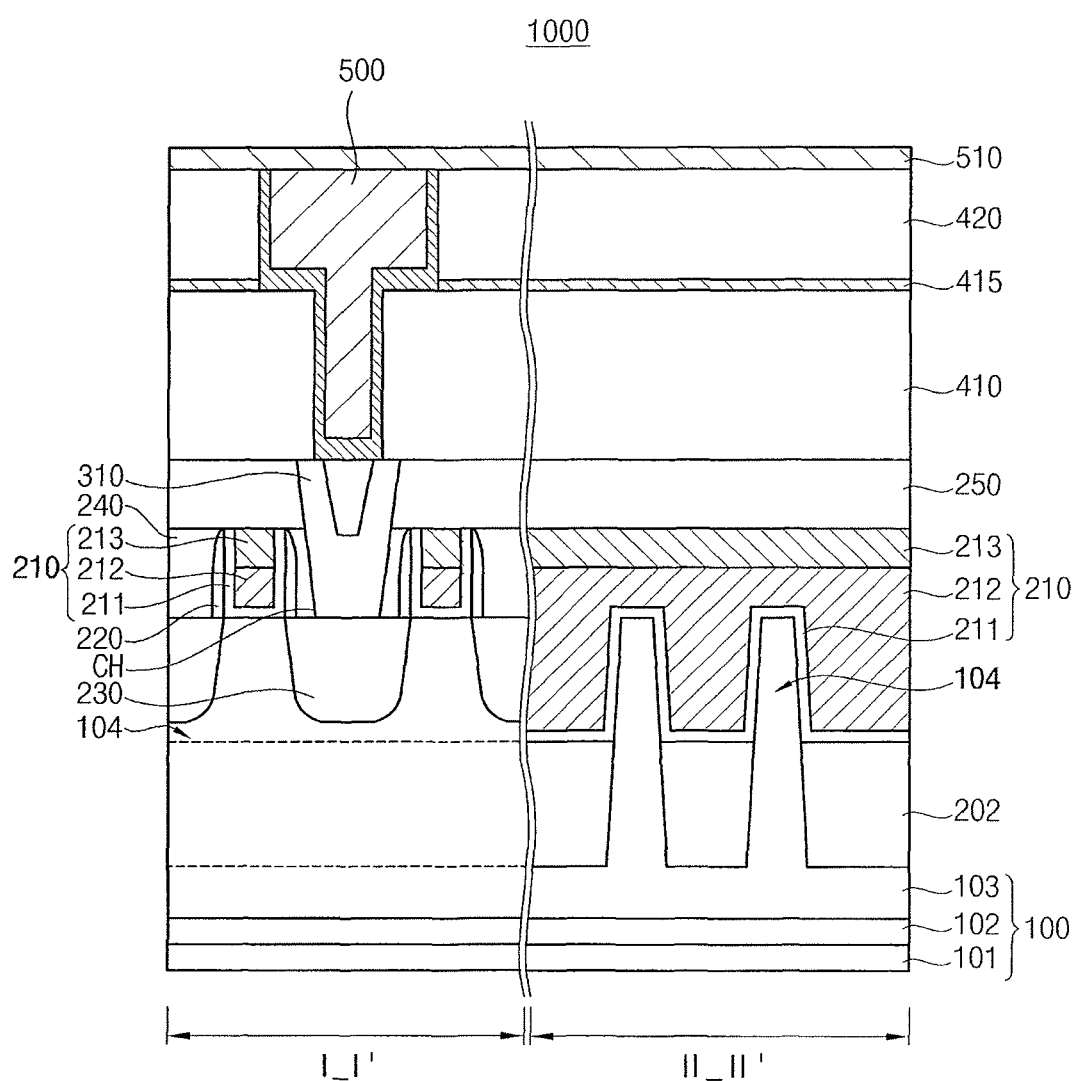
FIG. 1 illustrates a cross-sectional view of a semiconductor device in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will be understood that when an element is referred to as being "on," "connected to," "electrically connected to," or "coupled to" another component (i.e., element), it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a" "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a cross-sectional view illustrating a semiconductor device in accordance with an example embodiment. In FIG. 1, the section denoted by I_I' is a cross-sectional view cut in a direction along an active fin of the semiconductor device (referred to as first direction), and the section denoted by II_II' is a cross-sectional view cut in a direction along a gate line of the semiconductor device intersecting the active fin (referred to as second direction). The first and second directions are perpendicular to each other.

Referring to FIG. 1, a semiconductor device 1000 may include a semiconductor substrate 100 having an active fin 104, a gate line 210 on the substrate 100, and a contact structure 310 around the gate line 210.

For example, the substrate 100 may include a semiconductor substrate, e.g., a silicon wafer, with semiconductor characteristics. In the present example embodiment, the substrate 100 may include a silicon-on-insulator (SOI) substrate having a base body 101, a substrate insulator 102 covering the base body 101, and a semiconductor layer 103 that may cover the body insulator 102.

The semiconductor device 1000 may include a logic device, an image sensor device, e.g., a CMOS image sensor, and a memory device, e.g., a flash memory device and a dynamic random access memory (DRAM) device. Thus, the substrate 100 may be varied in accordance with characteristics and requirements of the semiconductor device 1000.

The base body 101 may include, e.g., single crystalline silicon, and the body insulator 102 may include, e.g., silicon oxide. The semiconductor layer 103 may include, e.g., single crystalline silicon.

The semiconductor layer 103 may include an active region protruding from the semiconductor layer 103 and extending in the first direction, and a field region enclosing the active region in such a way that neighboring active regions may be separated by the field region. For example, a device isolation layer may be filled into the field region, and the active region may protrude above the device isolation layer, e.g., in a fin shape. For that reason, the active region protruding above the device isolation layer, i.e., above the field region, may be provided as a fin-shaped active region. Hereinafter, the fin-shaped active fin will be referred to as an active fin 104.

Thus, the active fin 104 may be provided as a line extending in the first direction, and neighboring active fins 104 may be spaced apart from each other by a gap distance in the second direction substantially perpendicular to the first direction. Since the active fins 104 may extend in the first direction and the neighboring active fins 104 may be spaced by the device isolation layer in the second direction, the device isolation layer may also be shaped into a line extending in the first direction.

Therefore, the line-shaped active fins 104 and the device isolation layers may be alternately arranged in the second direction, and a top surface of the device isolation layer is lower than a top surface of the active fin 104. For example, the device isolation layer may include an oxide, e.g., silicon oxide, or a nitride, e.g., silicon nitride.

The gate line 210 may cross the active fin 104 and extend in the second direction, and neighboring gate lines 210 may be spaced apart from each other in the first direction. Thus, the active fin 104 may be partially covered with the gate line 210.

The gate line 210 may include a gate insulation pattern 211 extending in the second direction and covering top and side surfaces of the active fin 104 and a surface of the substrate 100 between the neighboring active fins 104, a gate conductive pattern 212 arranged on the gate insulation pattern 211 and having a thickness to fill a gap space between neighboring active fins 104, and a gate capping pattern 213 arranged on the gate conductive pattern 212 and having an upper surface coplanar with an uppermost surface of the gate insulation pattern 211. Since the gate insulation pattern 211 may be coplanar with an insulation interlayer pattern 240, the gate capping pattern 213 may be coplanar with an upper surface of the insulation interlayer pattern 240.

The gate insulation pattern 211 may include metal oxide having high dielectric constant, e.g., hafnium oxide ($HfO_2$), tantalum oxide ($Ta_2O_5$), zirconium oxide ($ZrO_2$), etc., and the gate conductive pattern 212 may include a low-resistance metal, e.g., aluminum (Al), copper (Cu), tantalum (Ta), and a nitride thereof. A pad oxide pattern may be further provided below the gate insulation pattern 211. The gate capping pattern 213 may include an insulation material covering the gate conductive pattern 212. The gate capping pattern 213 may minimize a parasitic capacitance between the contact structure 310 and the gate conductive pattern 212 and protect the gate conductive pattern 213 in subsequent processes. For example, the gate capping pattern 213 may include silicon oxide, silicon nitride, and silicon oxynitride.

In the present example embodiment, the gate line 210 may have a line width of about 3 nm to about 20 nm, e.g., about 5 nm to about 10 nm. A gate spacer 220 may be provided at both sides of the gate line 210, thus the gate line 210 may be protected from a subsequent etching process for forming a contact hole. Thus, a pair of the gate spacers 220 may be arranged symmetrically to each other with respect to the gate conductive pattern 212 along the first direction. The gate spacer 220 may include a nitride, e.g., silicon nitride.

A semiconductor junction 230 may be arranged on the active fin 104 around the gate line 210. Thus, source/drain regions may be provided with the semiconductor device 1000.

For example, the semiconductor junction 230 may include semiconductor materials that may be grown from the active fin 104 by an epitaxial growth process, and the semiconductor material may have a polarity of p-type or an n-type according to the structure of the semiconductor device 1000. In the present example embodiment, a recess may be formed on the active fin 104, and a semiconductor layer may be formed in the recess by the epitaxial process. Thereafter, p-type or n-type dopants may be implanted onto the semiconductor layer by an ion implantation process. Otherwise, the dopants may be directly implanted onto the active fin 104, so that the semiconductor junction 230 may be arranged at surface portions of the active fin 104. The semiconductor junction 230 may include, e.g., one of a silicon germanium (SiGe) layer, a germanium (Ge) layer, a silicon carbide (SiC) layer, and an indium gallium arsenide (InGaAs) layer.

First and second insulation interlayers 240 and 250 may be formed on the substrate 100 to a predetermined thickness to cover the gate line 210. A contact hole CH may be provided with, e.g., through, the first and the second insulation interlayers 240 and 250 so as to expose the semiconductor junction 230.

The first insulation interlayer 240 may fill a gap space between neighboring gate lines 210, and the semiconductor junctions 230 may be covered with the first insulation interlayer 240. The first insulation interlayer 240 may be shaped into a line extending in the second direction in parallel with the gate line 210 in such a way that the gate line 210 and the first insulation interlayer 240 may be alternately arranged with each other in the first direction. The second insulation interlayer 250 may be on the first insulation interlayer 240 to a predetermined thickness to cover the gate line 210, and may have a flat top surface. Therefore, the gate line 210 and the semiconductor junction 230 may be separated from upper conductive structures, e.g., wiring structures, that may be formed on the second insulation interlayer 250. For example, the first and the second insulation interlayers 240 and 250 may include one of silicon oxide, silicon nitride, and silicon oxynitride.

The contact hole CH may penetrate through the first and the second insulation interlayers 240 and 250 in such a way that the semiconductor junction 230 may be partially exposed through the contact hole CH. The contact structure 310 may be arranged in the contact hole CH, and may make contact with the semiconductor junction 230. In the present example embodiment, the contact structure 310 may include a single plug structure penetrating through the semiconductor junction 230.

Figure 2A:
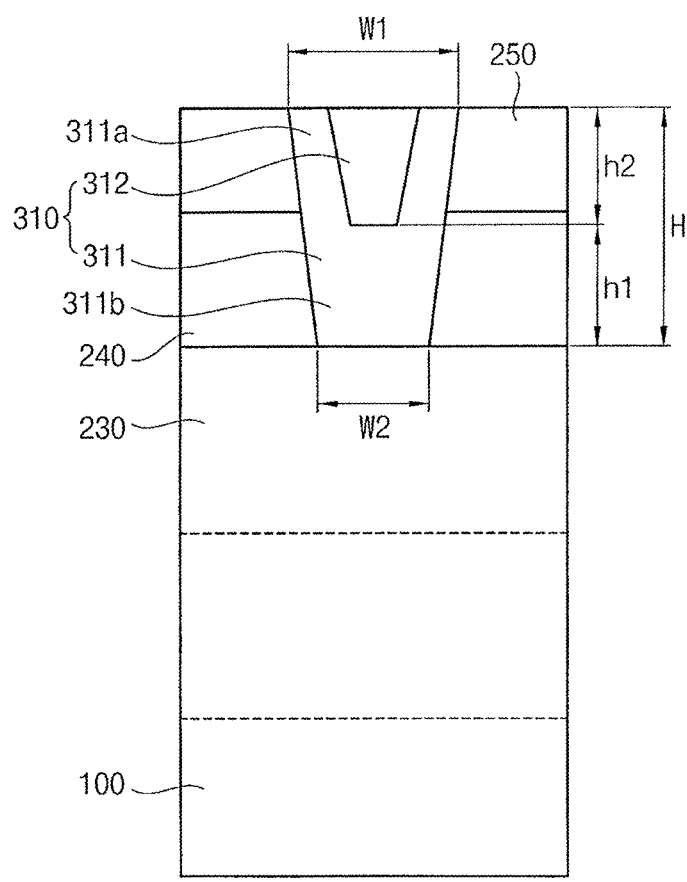
FIG. 2A illustrates an enlarged view of the contact structure of the semiconductor device shown in FIG. 1.
Figure 2B:
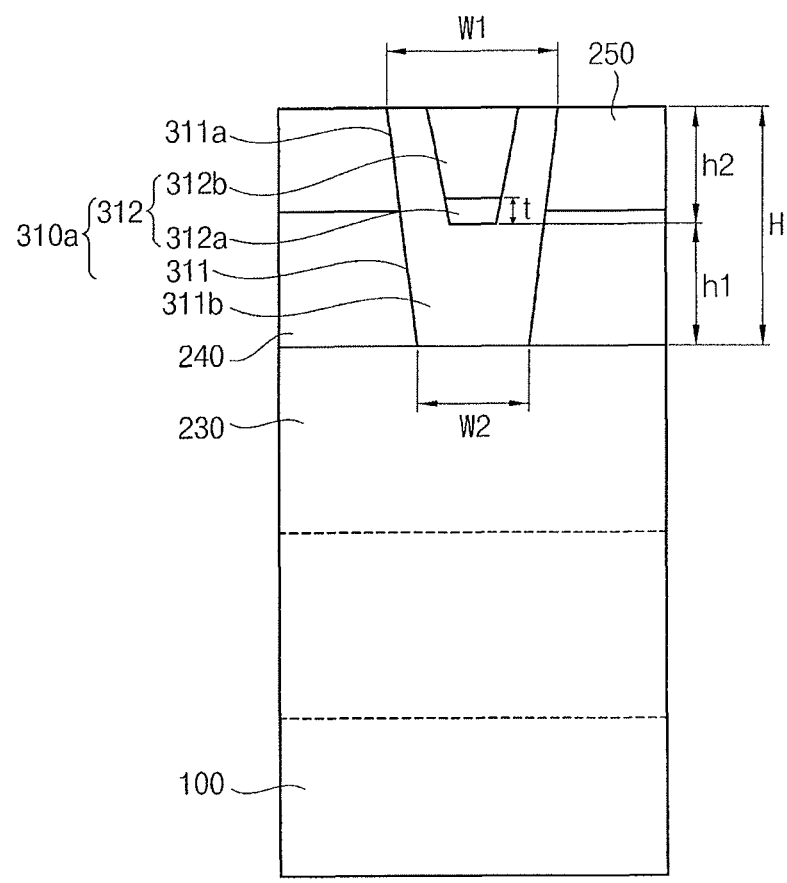
FIG. 2B illustrates a view of a modification of the contact structure shown in FIG. 2A.

FIG. 2A is an enlarged view illustrating the contact structure 310. FIG. 2B is a view illustrating a modification of the contact structure shown in FIG. 2A.

Referring to FIG. 2A, the contact structure 310 may include a barrier pattern 311 covering a sidewall and a lower portion of the contact hole CH, and a conductive contact pattern 312 enclosed, e.g., on three sides by the barrier pattern 311 and filling an upper portion of the contact hole H. For example, the barrier pattern 311 may include an upper barrier 311a on an upper portion of a sidewall of the contact hole CH, and a lower barrier 311b that may be integrally connected to the upper barrier 311a in one body together with the upper barrier 311a and may fill a lower portion of the contact hole H. The conductive contact pattern 312 may be enclosed by upper barrier 311a and may be arranged in such a configuration that a volume of the conductive contact pattern 312 may be smaller than a volume of the barrier pattern 311 in the contact hole CH.

In detail, the gate line 210 may be formed into a fine pattern having a width of about 3 nm to about 20 nm, and the gap space between neighboring gate lines 210 may be significantly downsized. Therefore, the width of the contact hole CH (between the neighboring gate lines 210) may also be reduced below tens of nanometers. In addition, as the thickness of the insulation interlayers 240 and 250 may not be reduced in the same ratio with respect to the reduction of the line width of the gate line 210, the aspect ratio of the contact hole CH may be significantly increased as the width of the contact hole CH is reduced. Accordingly, due to the increased aspect ratio, a lower portion of the contact hole CH may be harder to reach, thereby causing wider etching of an upper portion of the contact hole CH than a lower portion thereof. In other words, the contact hole CH may be shaped into a reverse trapezoid in which an upper side is greater than a lower side, i.e., the contact hole CH may have an upper width W1 and a lower width W2 smaller than the upper width W1.

Therefore, a lower portion of the contact hole CH may be filled with a barrier layer when the barrier layer is formed on the insulation interlayer along a surface profile of the contact hole CH on a basis of the upper width W1. That is, the lower portion of the contact hole CH having a high aspect ratio may be, e.g., completely, filled with the barrier layer having gap-fill characteristics better than a conductive layer for the conductive contact pattern 312, thereby preventing void defects in the contact structure 310 in the contact hole CH.

The upper portion of the contact hole CH may be formed in the second insulation interlayer 250, and the upper width W1 of the contact hole CH may be in a range of about 14 nm to about 20 nm. The lower portion of the contact hole CH may be formed in the first insulation interlayer 240, and the lower width W2 of the contact hole CH may be in a range of about 5 nm to about 10 nm. In such a case, the barrier layer may have a thickness of about 1 nm to about 5 nm on the sidewall of the upper portion of the contact hole CH, and a lump of the barrier layer at the lower portion of the contact hole CH may be formed into the lower barrier 311b.

Accordingly, the upper barrier 311a may be formed, e.g., conformally, on the upper sidewall of the contact hole CH, and the lower barrier 311b may be formed on the lower sidewall and bottom of the contact hole CH in one body together with the sidewall barrier 311a. Thus, the semiconductor junction 230 may be covered with the lower barrier 311b, and a barrier height h1 of the lower barrier 311b may be varied according to the lower width W2 and the thickness of the barrier layer.

For example, the barrier pattern 311 may include a single layer or a multilayer having at least one of a barrier metal and a metal nitride. Examples of the barrier pattern 311 may include tantalum (Ta), titanium (Ti), molybdenum (Mo), ruthenium (Ru), cobalt (Co), tungsten (W), titanium nitride (TiN), tantalum nitride (TaN), tungsten nitride (WN), etc. These may be used alone or in combinations thereof.

For example, the barrier pattern 311 may include a single layer having a metal nitride layer, or a dual layer having a metal layer and a metal nitride layer. When the barrier pattern 311 is provided as the dual layer, the barrier pattern 311 may include an anti-diffusion layer for preventing the conductive materials of the conductive contact pattern 312 from diffusing into the insulation interlayers 240 and 250 and into the semiconductor junction 230, and a glue layer for adhering the conductive contact pattern 312 to the anti-diffusion layer. In such a case, the thickness of the glue layer is greater than that of the anti-diffusion layer in the lower barrier 311.

In the present example embodiment, the barrier pattern 311 may include a single layer including titanium nitride (TiN), and the contact pattern 312 may be arranged at the upper portion of the contact hole CH that may be defined by the barrier pattern 311. The contact pattern 312 may be arranged in the contact hole CH in such a way that a wiring structure 500 may be electrically connected with the semiconductor junction 230.

For example, the contact pattern 312 may include a low-resistance material and thus may have low contact resistance with respect to a wiring structure 500 (FIG. 1). Examples of the low-resistance material for the contact structure 312 may include tantalum (Ta), titanium (Ti), molybdenum (Mo), ruthenium (Ru), cobalt (Co), tungsten (W), etc. These may be used alone or in combinations thereof.

The contact pattern 312 may be formed in the contact hole CH by sequential process of a deposition process and a planarization process. Otherwise, the contact pattern 312 may be formed just by a nucleation process for filling up the upper portion of the contact hole CH since the upper portion of the contact hole CH may be downsized by the barrier pattern 311.

For example, a metal solution having a crystal nucleus may be supplied into the upper portion of the contact hole CH that may be defined by the barrier pattern 311, and then a conductive metal pattern may be formed in the upper portion of the contact hole CH by the nucleation process as the contact pattern 312. In the present example embodiment, the contact pattern 312 may include a tungsten (W) pattern that may be formed by the nucleation process. Since the nucleation process may form a thin layer structure by a unit of molecule, the tungsten (W) pattern may have sufficient uniformity in the upper portion of the contact hole CH and may have sufficient adhesion to the barrier pattern 311.

In another example, the contact pattern 312 of a contact structure 310a may be formed by a sequential performance of a physical vapor deposition (PVD) process for improving adhesion to the barrier pattern 311 and a chemical vapor deposition (CVD) process for improving the process efficiency of forming the contact pattern 312. This will be described in more detail with reference to FIG. 2B.

As shown in FIG. 2B, a PVD metal pattern 312a may be formed on the lower barrier 311b by the PVD process, and a CVD metal pattern 312b may be formed on the PVD metal pattern 312a by a CVD process until the upper portion of the contact hole CH is filled. In such a case, the PVD metal pattern 312a may have a thickness t that is substantially identical to the lower width W2 of the contact hole CH (FIGS. 2A and 2B are not to scale).

That is, the contact pattern 312 may include a dual pattern having the PVD metal pattern 312a and the CVD metal layer 312b. The CVD metal pattern 312b may be sufficiently adhered to the barrier pattern 311 because the thickness t of the PVD metal pattern 312a is substantially identical to the lower width W2 of the PVD metal layer 312a. For example, the PVD metal pattern 312a may have a thickness of about 5 nm to about 10 nm. In the present example embodiment, the contact pattern 312 may include cobalt (Co) having a PVD cobalt layer on the lower barrier 311b and a CVD cobalt layer on the PVD cobalt layer.

In case that an overall height H of the contact structure 310 is constant, a contact height h2 of the contact pattern 312 may be varied according to the barrier height h1 of the lower barrier 311b. The barrier height h1 of the lower barrier 311b may be varied according to the lower width W2 of the contact hole CH and the thickness of the upper barrier 311a.

The lower width W2 of the contact hole CH may be determined by the control of the etching conditions for forming the contact hole CH, and the thickness of the upper barrier 311a may be determined by the control of the deposition conditions for forming the barrier pattern 311. Thus, the barrier height h1 of the lower barrier 311b may be controlled by varying both of the etching conditions for forming the contact hole CH and the deposition conditions for forming the barrier pattern 311.

When the contact height h2 of the contact pattern 312 is excessively high, void defects may occur in the contact pattern 312 due to the high aspect ratio of the contact hole CH. In contrast, when the contact height h2 of the contact pattern 312 is excessively small, the barrier height h1 of the barrier pattern 311 may become excessively great, and thus, the contact pattern 312 and the semiconductor junction 230 may be excessively spaced apart, thereby increasing the contact resistance between the contact pattern 312 and the semiconductor junction 230.

For the above reasons, the barrier height h1 of the lower barrier 311b is limited to a proper range. In the present example embodiment, the barrier height h1 of the lower barrier 311b may be about ½ to ⅔ times the overall height H of the contact structure 310. Therefore, the contact resistance between the contact structure 310 and the semiconductor junction 230 may be minimized as much as possible, and the process defects caused by the high aspect ratio, e.g., void defects, may also be minimized in the contact structure 310. For example, when the overall height H of the contact structure 310 is in a range of about 40 nm to about 100 nm, and the thickness of the upper barrier 311a is in a range of about 0.5 nm to about 2.0 nm, the barrier height h1 of the lower barrier 311b may be in a range of about 20 nm to about 50 nm.

The contact structure 310 may be shaped into a reverse trapezoid in which an upper width is greater than a lower width, i.e., the upper width W1 may be greater than the lower width W2 in the contact hole CH. Therefore, the contact structure 310 may have stable electric characteristics and minimal void defects, even though the line width of the gate line 210 is reduced to below about 10 nm, and the gap distance between neighboring gate lines 210 may be significantly reduced according to the critical dimension (CD) reduction of the semiconductor devices 1000.

Referring back to FIG. 1, the contact structure 310 may be covered with a first insulation layer 410 having a via hole through which the contact structure 310 may be exposed. In modified example embodiment, a contact pad or a via (not shown) may be selectively arranged in such a configuration that the contact structure 310 may make, e.g., direct, contact with the contact pad or the via. In such a case, the contact pad or the via may be covered with the first insulation layer 410 and may be exposed through the via hole.

An etch stop layer 415 may be arranged on the first insulation layer 410, and a second insulation layer 420 may be arranged on the etch stop layer 415. A trench may be provided with, e.g., through, the second insulation layer 420 and the etch stop layer 415 in such a configuration that the trench may be communicating, e.g., in direct contact and fluid communication, with the via hole.

A wiring structure 500 may be arranged in the via hole and the trench and may be connected to the contact structure 320. The wiring structure 500 may include a low-resistance metal, e.g., copper (Cu), aluminum (Al), tungsten (W), titanium (Ti), and tantalum (Ta). Thus, external signals may be transferred to the semiconductor junction 230 through the contact structure 310 by the wiring structure 500. When the contact pad or the via may be arranged in the semiconductor device 1000, the wiring structure 500 may be connected to the contact structure 310 via the contact pad.

A metal silicide layer may be further provided between the wiring structure 500 and the contact pad 320, thereby decreasing the contact resistance between the contact pad 320 and the wiring structure 500. A passivation layer 510 may be on the second insulation layer 420 and the wiring structure 500, so that the wiring structure 500 and the underlying structures, e.g., the gate line 210 and the contact structure 310, may be protected from surroundings by the passivation layer 510.

According to the above example embodiments, a lower portion of the contact hole may be filled with the barrier pattern, and an upper portion of the contact hole may be filled with the contact pattern. As such, the lower portion of the contact hole may be sufficiently filled without any void defects in spite of the high aspect ratio of the contact hole due to the high gap-fill characteristics of the barrier pattern, and thus, the contact resistance of the contact structure may not be deteriorated in spite of the size reduction of the semiconductor device.

That is, when the gap space between neighboring gate lines is reduced and the line width of the gate line decreases to below 10 nm, void defects in the contact hole having a high aspect ratio may be prevented or substantially minimized by controlling the etching conditions for forming the contact hole and the deposition conditions for forming the barrier pattern in the contact hole. Therefore, the finFET may have sufficiently good operation stability and reliability even though the gate line of the finFET may have a line width under about 10 nm.

Hereinafter, a method of manufacturing the semiconductor device 1000 will be described in detail with reference to FIGS. 3 to 10. FIGS. 3 to 10 are cross sectional views illustrating processing steps for a method of manufacturing the semiconductor device 1000.

Figure 3:
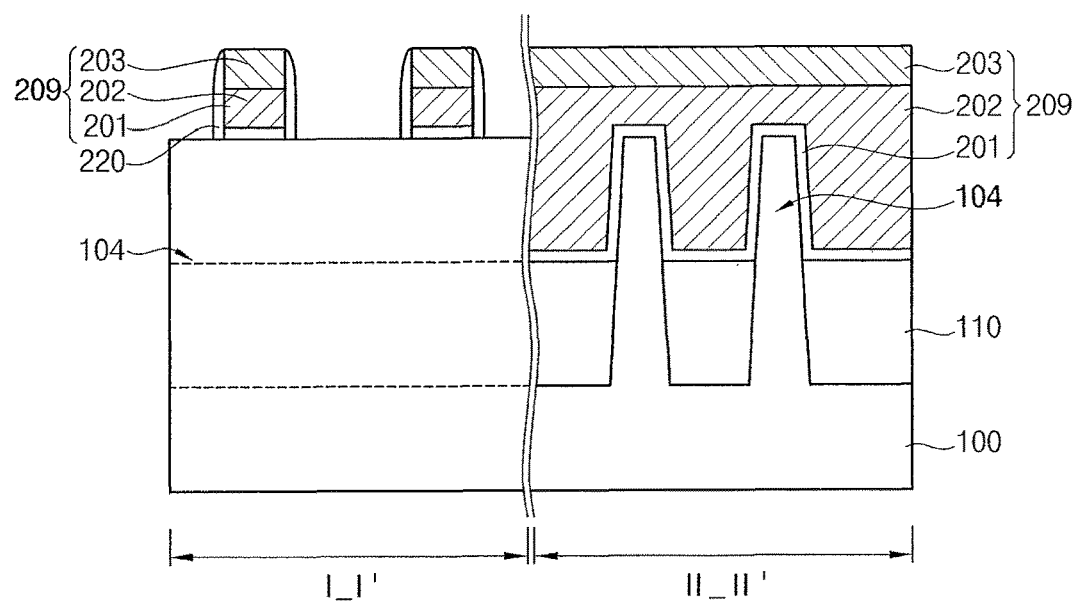
FIGS. 3 to 10 illustrate cross sectional views of processing steps for a method of manufacturing the semiconductor device shown in FIG. 1.

Referring to FIG. 3, the semiconductor substrate 100 may be partially etched into a line shape extending in the first direction, to thereby form an isolation trench in the first direction.

Then, a preliminary device isolation layer may be formed on the substrate 100 to a sufficient thickness to fill up the isolation trench, and then may be planarized until a top surface of the substrate 100 is exposed. Thus, the preliminary device isolation layer may remain just in the isolation trench on the substrate 100. Then, an upper portion of the preliminary device isolation layer may be removed from the isolation recess in such a way that the substrate 100 around the isolation trench may protrude above the preliminary device isolation layer, thereby forming the device isolation layer 110 enclosing the protruding active region of the substrate 100. For example, the device isolation layer 110 may include silicon oxide or silicon nitride. As a result of the formation process of the device isolation layer 110, the protruding active region defined by the device isolation layer 110 may be formed into the active fin 104 that may protrude above the device isolation layer 110 and be shaped into a line extending in the first direction.

A dummy gate line 209 may be formed on the substrate 100 as a line shape extending in the second direction substantially perpendicular to the first direction. A dummy gate insulation layer, a dummy gate electrode layer, and a gate mask layer may be sequentially formed on the substrate 100 having the device isolation layer 110 and the active fin 104. Then, the gate mask layer may be patterned into a gate mask pattern 203 by a photolithography process, and then the dummy gate electrode layer and the dummy gate insulation layer may be sequentially removed from the substrate 100 by an etching process using the gate mask pattern 203 as an etching mask, thereby forming a dummy gate insulation pattern 201 and a dummy gate electrode 202 under the gate mask pattern 203. That is, the dummy gate insulation pattern 201 may be formed into a line extending in the second direction and covering a top surface and sidewalls of the active fin 104 and on the device isolation layer 110, and the dummy gate electrode 202 may be formed on the dummy gate insulation layer 201 to a sufficient thickness to fill up the gate space between the neighboring active fins 104. Thus, the dummy gate line 209 may include the dummy gate insulation pattern 201, the dummy gate electrode 202, and the gate mask pattern 203 that may be sequentially stacked on the substrate 100.

The gate spacer 220 may be formed on a sidewall of the dummy gate line 209. Then, a recess may be formed on the active fin 104 around the dummy gate line 209 by an etching process and an epitaxial pattern may be formed in the recess by a selective epitaxial growth (SEG) process.

Figure 4:
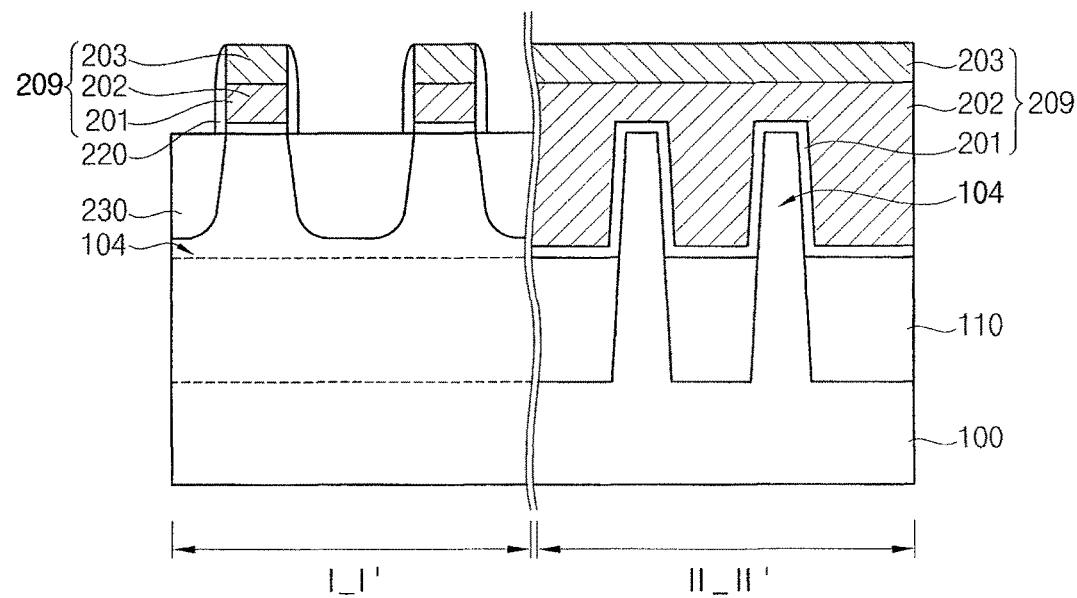

Referring to FIG. 4, the semiconductor junction 230 may be formed on the active fin 104 around the dummy gate line 209, thereby forming source/drain regions of the semiconductor device 1000. For example, p-type or n-type dopants may implanted onto the active fin 104 by an ion implantation process to thereby form the semiconductor junction 230 on the active fin 104 around the dummy gate line 209. Otherwise, the dopants may also be implanted onto the epitaxial pattern on the active fin 104 around the dummy gate line 209. In such a case, the dopants may also be implanted in situ with the SEG process, so that the semiconductor junction 230 may be formed simultaneously with the epitaxial pattern on the active fin 104.

Figure 5:
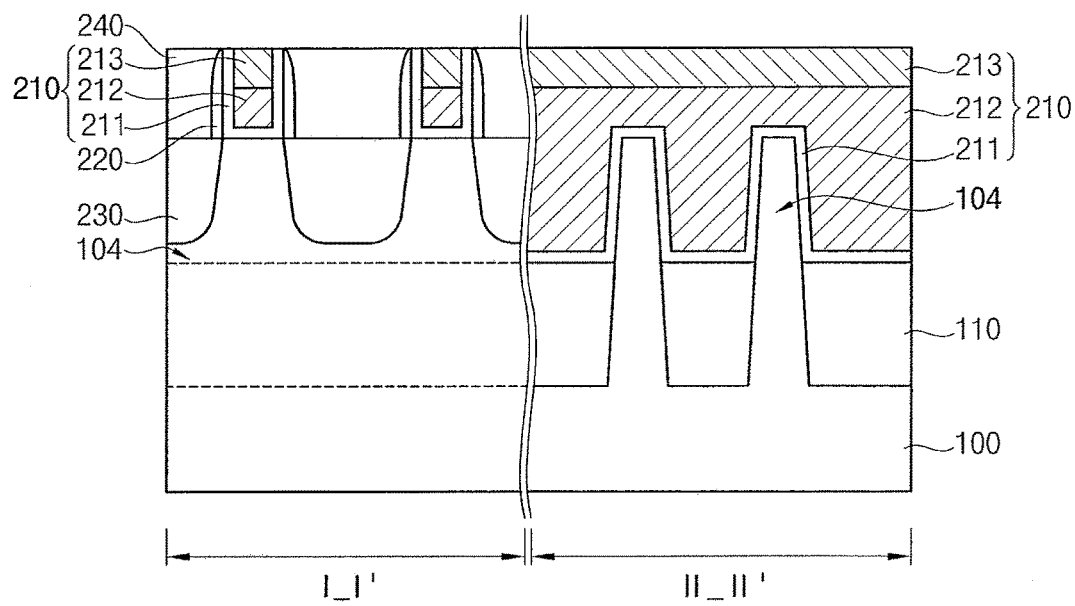

Referring to FIG. 5, the first insulation interlayer 240 may be formed on the substrate 100 to a sufficient thickness to cover the dummy gate line 209, the gate spacer 220, the active fin 104, and the device isolation layer 110, and then may be planarized by a chemical mechanical polishing (CMP) process or an etch-back process until the top surfaces of the dummy gate line 209 and the gate spacer 220 may be exposed. The first insulation interlayer 240 may include, e.g., silicon oxide or silicon nitride.

Then, the dummy gate line 209 may be removed from the substrate 100, thereby forming a line-shaped gate trench in the second direction. The gate insulation pattern 211, the gate conductive pattern 212, and the gate capping pattern 213 may be sequentially stacked on the substrate 100 in the gate trench.

For example, a gate insulation layer may be formed on the first insulation interlayer along a surface profile of the gate trench, and a gate conductive layer may be formed on the gate insulation layer to a sufficient thickness to fill up the gate trench. For example, the gate insulation layer may include a metal oxide having a high dielectric constant, e.g., hafnium oxide ($HfO_2$), tantalum oxide ($Ta_2O_5$), zirconium oxide ($ZrO_2$), etc., and the gate conductive layer may include a low-resistance metal, e.g., aluminum (Al), copper (Cu), tantalum (Ta), and a nitride thereof.

Thereafter, the gate conductive layer and the gate insulation layer may be partially removed from the substrate 100 by a planarization process until a top surface of the first insulation interlayer 240 is exposed, thereby forming the gate insulation pattern 211 and a preliminary gate conductive pattern in the gate trench. Then, an upper portion of the preliminary gate conductive pattern may be removed from the gate trench by an etching process, to thereby form the gate insulation pattern 211 covering the sidewalls and bottom of the gate trench and the gate conductive pattern 212 located at a lower portion of the gate trench. A gate recess may be formed on the gate conductive pattern 212 at an upper portion of the gate trench. A capping layer may be formed on the first insulation interlayer 240 to a sufficient thickness to fill up the gate trench and may be planarized until the top surface of the first insulation interlayer 240 may be exposed, thereby forming the gate capping pattern 213 covering the gate conductive pattern 212 in the gate recess. The capping layer may include one of, e.g., silicon oxide, silicon nitride and silicon oxynitride.

Therefore, the stack structure of the gate insulation pattern 211, the gate conductive pattern 212, and the capping pattern 213 may be formed into a line extending in the second direction as the gate line 210. Thus, the gate line 210 and the semiconductor junction 230 may be formed into a finFET. The gap space between the neighboring gate lines 210 may be filled with the first insulation interlayer 240, so that the neighboring gate lines 210 may be electrically insulated from each other. The gate line 210 may have a line width of about 3 nm to about 15 nm, e.g., about 5 nm to about 10 nm.

Figure 6:
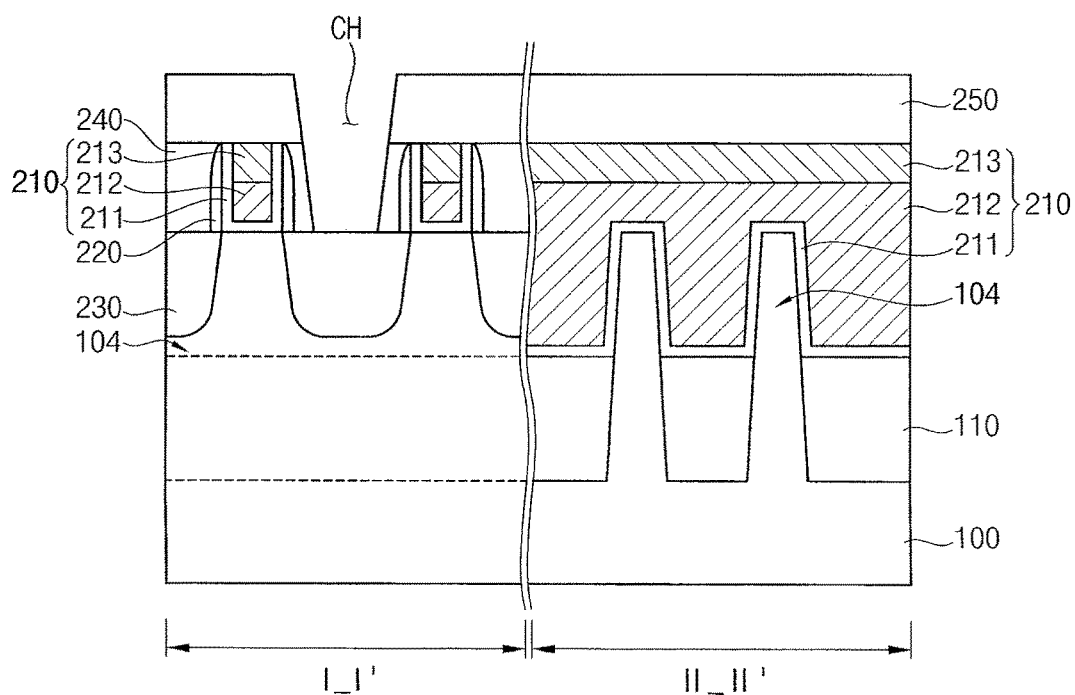

Referring to FIG. 6, the second insulation interlayer 250 may be formed on the first insulation interlayer 240 to a sufficient thickness to cover the gate line 210 and the semiconductor junction 230. The contact hole CH may be formed through the first and the second insulation interlayers 240 and 250 in such a way that the semiconductor junction 230 is exposed through the contact hole CH.

In detail, a mask pattern may be formed on the second insulation interlayer 250, and an anisotropic etching process may be sequentially performed on the second and the first insulation interlayers 250 and 240, to thereby form the contact hole CH exposing the semiconductor junction 230. The anisotropic etching process may include, e.g., a reactive ion etching (RIE) process, a magnetic enhanced RIE process, and an inductively coupled plasma etching process. In addition, if the first and second insulation interlayers 240 and 250 around the contact hole CH are damaged in the etching process, a curing process for curing the damages around the contact hole CH may be further performed on the first and second insulation interlayers 240 and 250.

As illustrated in FIG. 6, the contact hole CH may be shaped as a reverse trapezoid, so the upper width W1 of the contact hole CH, i.e., a distance as measured along an imaginary line coextensive with an upper surface of the second insulation interlayer 250, may be greater than the lower width W2 of the contact hole CH, i.e., a distance as measured along an imaginary line coextensive with a lower surface of the first insulation interlayer 240. As such, the lower barrier 311b may be easily formed at a lower portion of the contact hole CH. For example, the contact hole CH may have the lower width W2 of about 5 nm to about 10 nm, and the upper width W1 of about 14 nm to about 20 nm.

Figure 7:
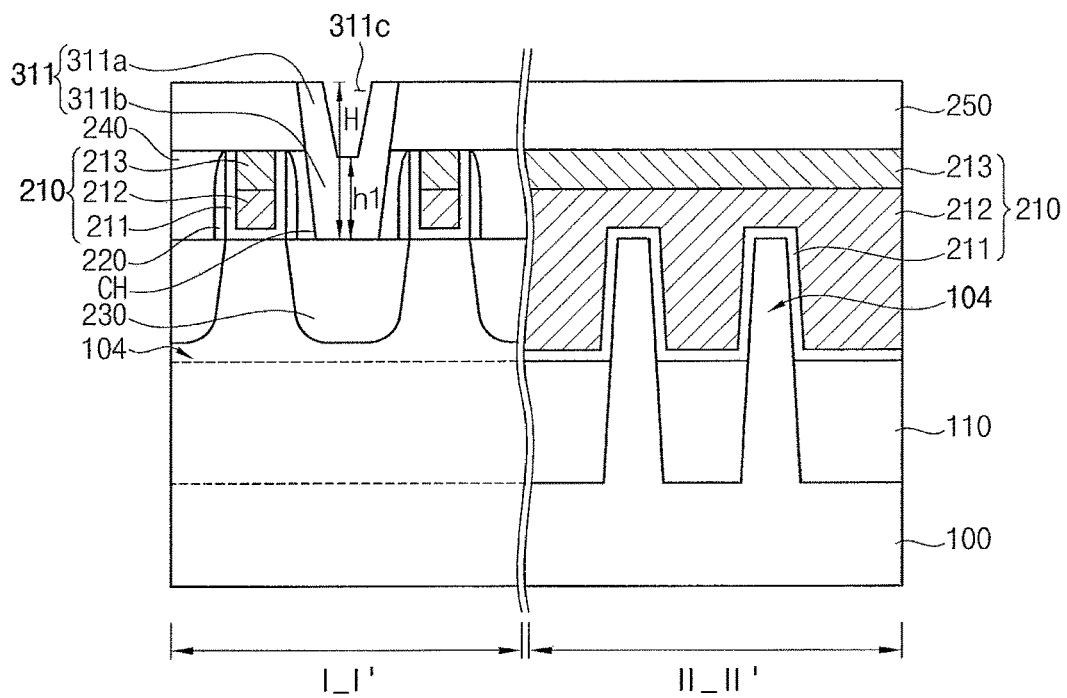

Referring to FIG. 7, the barrier pattern 311 may be formed in the contact hole CH. That is, the barrier pattern 311 may be formed on the sidewall and the lower portion of the contact hole CH.

In detail, a barrier layer may be formed on the sidewall and the bottom of the contact hole CH, and on the top surface of the second insulation interlayer 250. For example, as illustrated in FIG. 7, the barrier layer may be formed conformally only on the upper sidewall of the contact hole CH, while completely filling the bottom of the contact hole CH. Then, the barrier layer may be planarized by a planarization process until the top surface of the second insulation interlayer 250 is exposed, thereby forming the upper barrier 311a of the barrier pattern 311 covering the upper sidewall of the contact hole CH and the lower barrier 311b of the barrier pattern 311 filling the lower portion of the contact hole CH. For example, as the barrier layer may be formed conformally on the upper sidewall of the contact hole CH, an opening 311c, e.g., a trench, may be defined by the upper barrier 311a and above the lower barrier 311b.

The barrier pattern 311 may prevent the conductive materials of the contact pattern 312 (to be formed subsequently in the opening 311c) from diffusing into the first and the second insulation interlayers 240 and 250 in a subsequent deposition process. The barrier layer may include one of, e.g., tantalum (Ta), titanium (Ti), molybdenum (Mo), ruthenium (Ru), cobalt (Co), tungsten (W), titanium nitride (TiN), tantalum nitride (TaN), tungsten nitride (WN), and combinations thereof.

The barrier layer may be formed into a single metal layer of or a dual layer of a metal layer and a metal nitride layer. The barrier layer may be formed by a deposition process, e.g., a chemical vapor deposition (CVD) process, an atomic layer deposition (ALD) process, and a physical vapor deposition (PVD) process.

For example, since the gap space between the neighboring gate lines 210 may be reduced due to the critical dimension (CD) reduction of the semiconductor device 1000, and the contact hole CH may be shaped into a reverse trapezoid, a portion of the barrier layer at the bottom of the contact hole CH may completely fill the bottom of the contact hole CH, while only conformally covering the upper portion of the contact hole CH. Thus, the barrier layer may be uniformly formed on the sidewall of the upper portion of the contact hole CH as the upper barrier 311a, and may be lumped into the lower barrier 311b filling up the lower portion of the contact hole CH, thereby forming the barrier pattern 311 in the contact hole CH.

In such a case, the barrier height h1 of the lower barrier 311b may be controlled by the thickness of the upper barrier 311a, and the thickness of the upper barrier 311a may be varied by changing the deposition conditions of the barrier layer. Thus, the barrier height h1 of the lower barrier 311b may be controlled by the deposition conditions of the barrier layer. For example, the barrier height h1 of the lower barrier 311b may be about ½ to about ⅔ times the overall height H of the contact hole CH.

For example, when the overall height H of the contact hole CH is in a range of about 40 nm to about 100 nm, and the lower width W2 of the contact hole CH is in a range of about 5 nm to about 10 nm, the barrier layer may be formed to a thickness of about 0.5 nm to about 2.0 nm, i.e., the thickness of the upper barrier 311a is about 0.5 nm to about 2.0 nm. Thus, the lower barrier 311b may be formed to have a height h1 of about 20 nm to about 50 nm.

Figure 8:
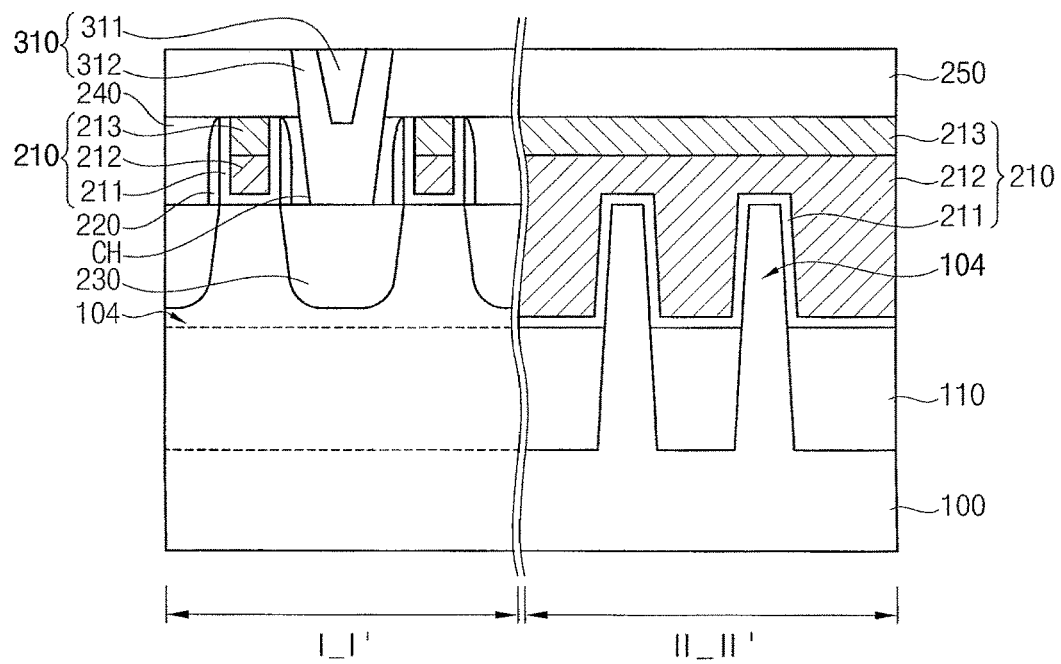

Referring to FIG. 8, the contact pattern 312 may be formed in the upper portion of the contact hole CH defined by the upper barrier 311a and the lower barrier 311b, i.e., the contact pattern 312 may be formed in the opening 311c. Thus, the contact hole CH may be filled with the barrier pattern 311 and the contact pattern 312, thereby forming the contact structure 310 in the contact hole CH.

For example, a metal solution having a crystal nucleus may be supplied into the upper portion of the contact hole CH, and then a conductive metal pattern may be formed in the upper portion of the contact hole CH by the nucleation process as the contact pattern 312. The conductive metal pattern for the contact pattern 312 may include one of, e.g., tantalum (Ta), titanium (Ti), molybdenum (Mo), ruthenium (Ru), cobalt (Co), tungsten (W) and combinations thereof. In the present example embodiment, the contact pattern 312 may include a tungsten (W) pattern formed by the nucleation process.

While the present example embodiment discloses a nucleation process in which no planarization process is required for forming the contact pattern 312, the contact pattern 312 may also be formed by other processes. For example, the contact pattern 312 may be formed by a sequential performance of a deposition process for forming a metal layer on the second insulation interlayer 250 to a sufficient thickness to fill up the upper portion of the contact hole CH, followed by a planarization process for partially removing the metal layer in such a way that the metal layer remains just in the upper portion of the contact hole CH.

In another example, the contact structure 312 may also be formed by a sequential performance of a physical vapor deposition (PVD) process for improving adhesion to the barrier pattern 311, and a chemical vapor deposition (CVD) process for improving the process efficiency of forming the contact pattern 312. This will be described with reference to FIG. 9.

Figure 9:
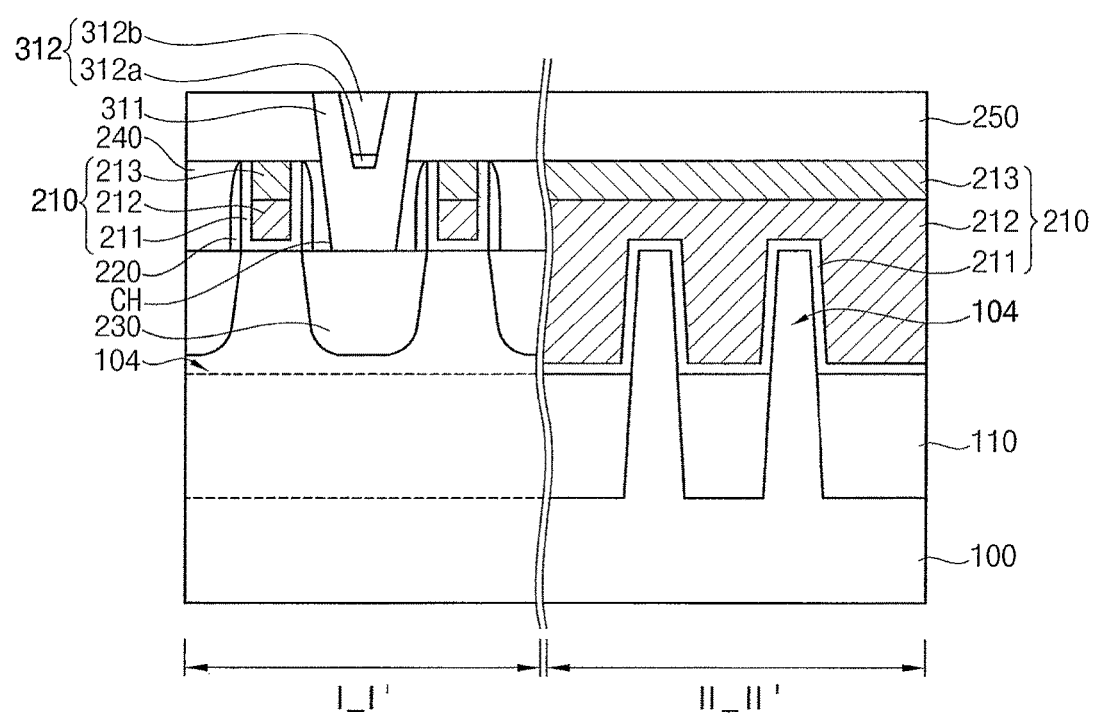

Referring to FIG. 9, a PVD metal pattern 312a may be formed on the lower barrier 311b by the PVD process, and a CVD metal layer may be formed on the PVD metal pattern 312a and on the second insulation interlayer 250 by a CVD process. Then, the CVD metal layer may be planarized by a planarization process until the top surface of the second insulation interlayer 250 is exposed, thereby forming the CVD metal pattern 312b covering the PVD metal pattern 312a and filling up the upper portion of the contact hole CH. In such a case, the PVD metal pattern 312a may have a thickness t that is substantially identical to the lower width W2 of the contact hole CH.

Therefore, the contact pattern 312 may include a dual pattern having the PVD metal pattern 312a and the CVD metal layer 312b. The CVD metal pattern 312b may be sufficiently adhered to the barrier pattern 311 because the thickness t of the PVD metal pattern 312a may be substantially identical to the lower width W2 of the PVD metal layer 312a. For example, the PVD metal pattern 312a may have the thickness of about 5 nm to about 10 nm. In the present example embodiment, the contact pattern 312 may include cobalt (Co) having a PVD cobalt layer on the lower barrier 311b and a CVD cobalt layer on the PVD cobalt layer.

Figure 10:
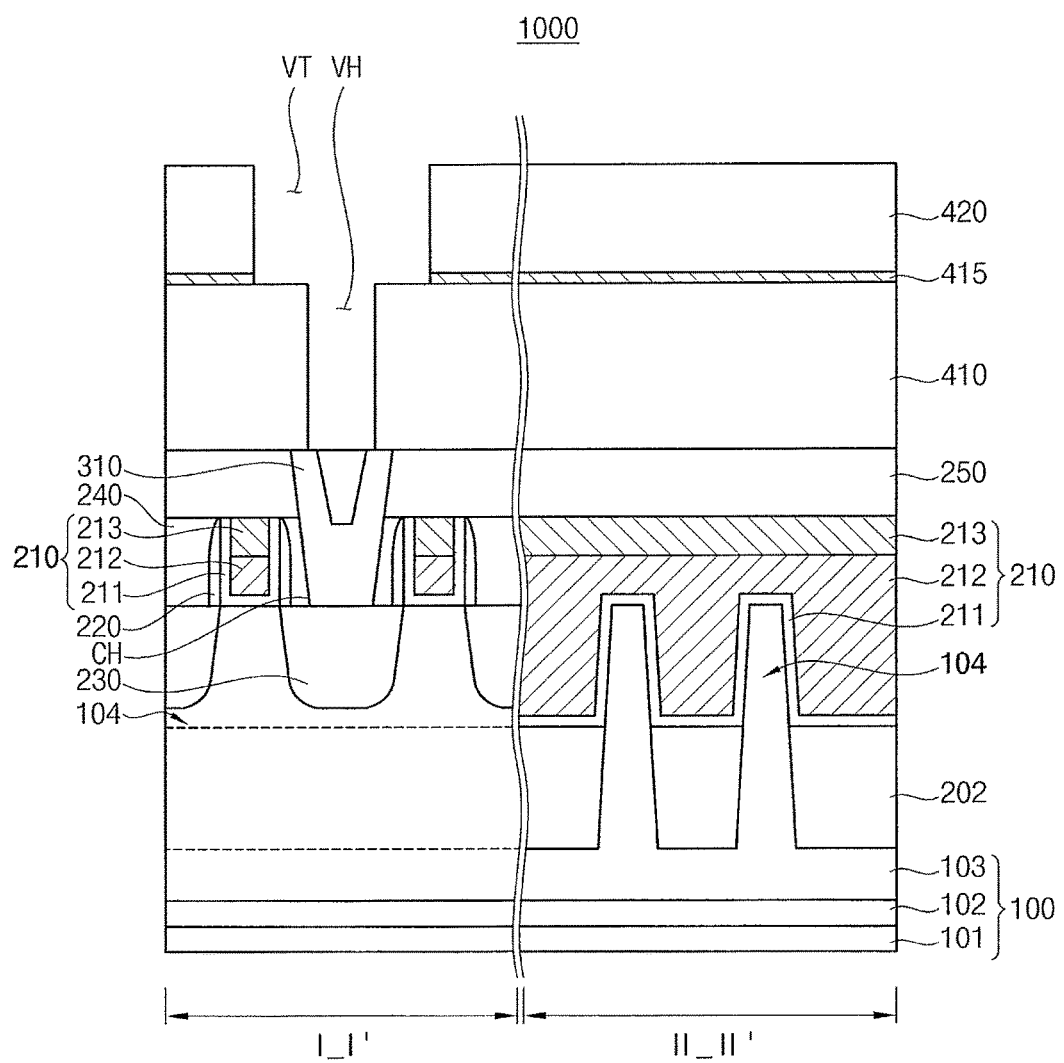

Referring to FIG. 10, the first insulation layer 410 may be formed on the second insulation interlayer 250, and the etch stop layer 415 and the second insulation layer 420 may be sequentially formed on the first insulation layer 410. Then, the second insulation layer 420, the etch stop layer and the first insulation layer 410 may be sequentially and partially removed from the substrate 100, thereby forming a via hole VH and a via trench VT through which the contact structure 310 may be exposed.

Thereafter, the wiring structure 500 may be formed in the via hole VH and via trench VT and the passivation layer 510 covering the wiring structure 500 may be formed on the second insulation layer 420, thereby completing the semiconductor device 1000.

The above-described semiconductor devices may be used for transistors of various digital or analogue circuits. For example, the present example embodiments of the semiconductor devices may be utilized as high voltage transistors of peripheral circuit for the flash memory devices or EEPROM (electrically erasable and programmable read only memory) devices that may be operated by a high voltage power.

For example, the present example embodiments of the semiconductor devices may be used for transistors for a high voltage driving integrated circuit (IC) device that may require a driving power over about 10V. For example, the driving IC device for an LCD apparatus may require the driving power of about 20V to about 30V, and the driving IC device for a plasma display panel (PDP) may require the driving power of about 100V or more. The above-described semiconductor devices may be sufficiently applied to the transistor of the driving IC device for the LCD apparatus or the PDP apparatus as well as a mobile display apparatus.

Figure 11:
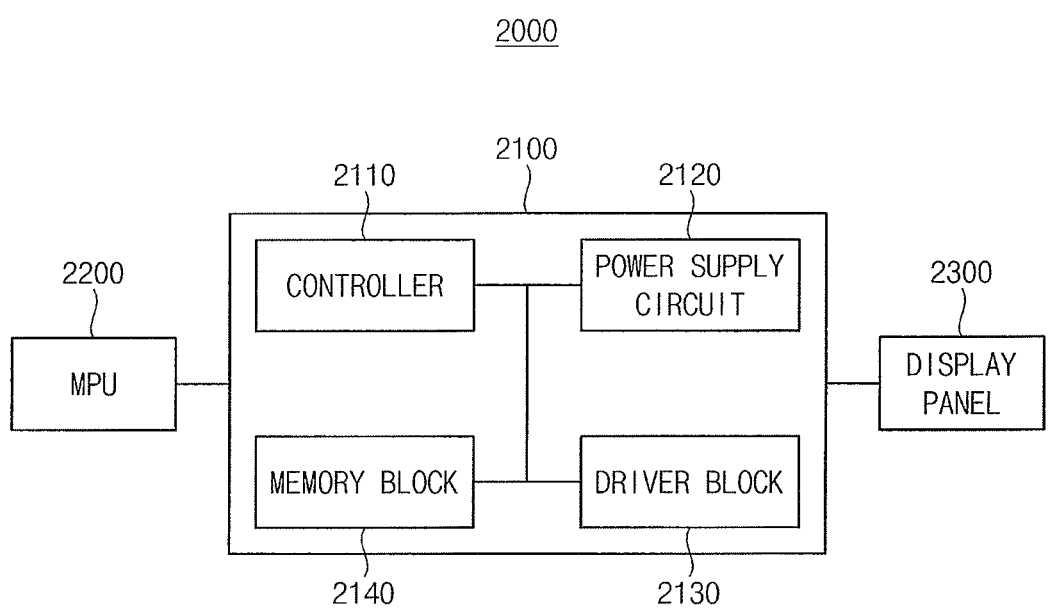
FIG. 11 illustrates a schematic block diagram of a display apparatus including semiconductor devices in accordance with example embodiments.

FIG. 11 is a schematic block diagram illustrating a display apparatus including semiconductor devices in accordance with example embodiments.

Referring to FIG. 11, a display apparatus 2000 may include a display drive IC (DDI) device 2100, a main processing unit (MPU) 2200 connected to the DDI device 2100 and processing image signals, and a display panel 2300 driven by the DDI device 2100 and displaying images in response to the image signals.

The DDI device 2100 may include a controller 2110, a power supply circuit 2120, a driver block 2130, and a memory block 2140.

The controller 2110 may decode the instructions transferred from the MPU 2200 and may control each operation block of the DDI device 2100 in response to the instructions. The power supply circuit 2120 may generate a driving power in response to a control signal of the controller 2110. The driver block 2130 may drive the display panel 2300 to operate by using the driving power. The display panel 2300 may include a flat display panel, e.g., a liquid crystal display (LCD) panel and a plasma display panel (PDP), as well as a mobile display panel.

The memory block 2140 may temporarily store the instructions that may be applied to the controller 2110, the control signals that may be generated from the controller 2110 and various processing data for operating the display apparatus 2000. Thus, the memory block 2140 may include a plurality of random access memory (RAM) devices and/or read only memory (ROM) devices.

For example, the power supply circuit 2120, the driver block 2130, and the memory block 2140 may include a plurality of the finFETs exemplarily described in detail with reference to FIGS. 1, 2A and 2B.

The size of the DDI device 2100 may be reduced and the occupancy area of the power supply circuit 2120, the driver block 2130, and the memory block 2140 may decrease in accordance with the recent technical trends of small size and thickness of the display apparatus 2000, so that the width of gate line and the width of the contact structure of the finFET in each of the power supply circuit 2120, the driver block 2130, and the memory block 2140 may be extremely reduced. However, the contact structure of the finFET may include the barrier pattern at the lower portion of the contact hole and the contact pattern at the upper portion of the contact hole, thus void defects in the contact structure and the increase of the contact resistance between the contact structure and the semiconductor junction of the source/drain regions in the finFET may be sufficiently prevented or minimized in spite of the high aspect ratio of the downsized finFET. Therefore, the display apparatus 2000 may have sufficiently good operation stability and reliability in spite of the size reduction of the finFET.

Figure 12:
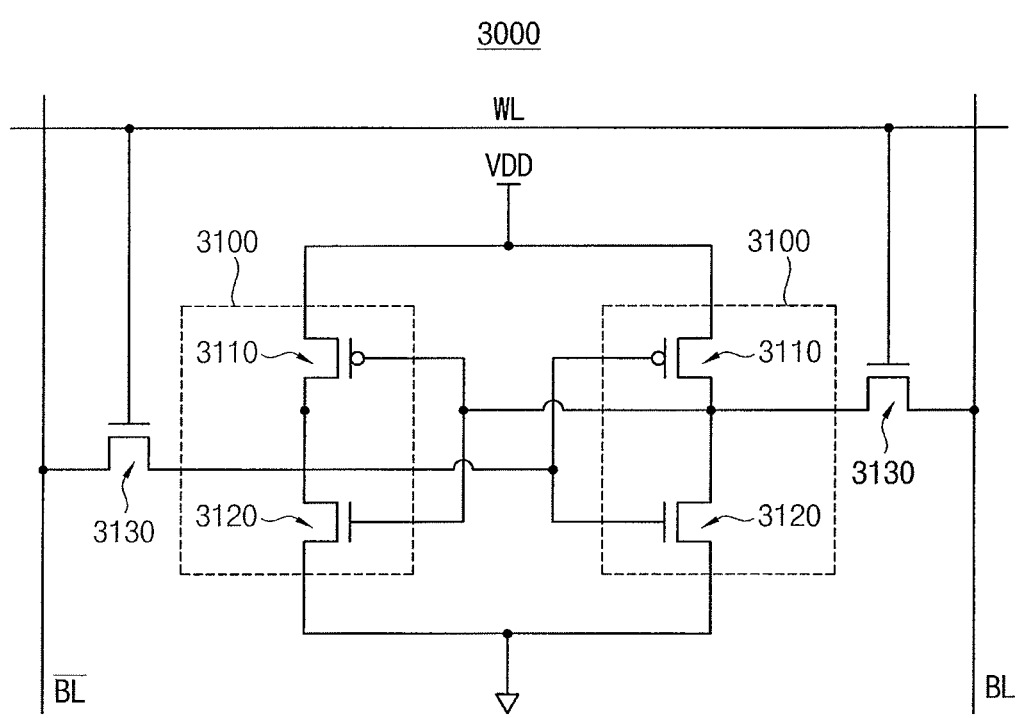
FIG. 12 illustrates a circuit diagram of a CMOS SRAM including semiconductor devices in accordance with example embodiments.

FIG. 12 is a circuit diagram illustrating a CMOS SRAM including semiconductor devices in accordance with example embodiments.

Referring to FIG. 12, the CMOS SRAM device 3000 may include a pair of driving transistors 3100. Each of the driving transistors 3100 may include a PMOS transistor 3110 connected to a power terminal Vdd, an NMOS transistor 3120 connected to a ground terminal, and a transfer transistor 3130. The source electrode of the transfer transistor 3130 may be connected to a common node of the PMOS transistor 3110 and the NMOS transistor 3120. The power terminal Vdd may be connected to the source electrode of the PMOS transistor 3110 and the ground terminal may be connected to the source electrode of the NMOS transistor 3120. A word line WL may be connected to a gate electrode of the transfer transistor 3130. A bit line BL may be connected to a drain electrode of one of the pair of the transfer transistor 3130 and a complementary bit line $\overline{BL}$ may be connected to a drain electrode of the other transfer transistor 3130.

The example embodiments of the finFET described with reference to FIGS. 1, 2A and 2B may be applied to at least one of the PMOS transistor 3110, the NMOS transistor 3120 and the transfer transistor 3130. Thus, although the CMOS SRAM device 3000 may be downsized and as a result, the finFET in the PMOS transistor 3110, NMOS transistor 3120 and the transfer transistor 3130 may have a small line width and an occupancy area, the contact resistance of the contact structure in the finFET may not be deteriorated in spite of the size reduction of the finFET and the void defects may be minimized in the contact structure in spite of the high aspect ratio of the contact hole, thereby increasing the operation reliability and stability of the CMOS SRAM 3000.

Figure 13:
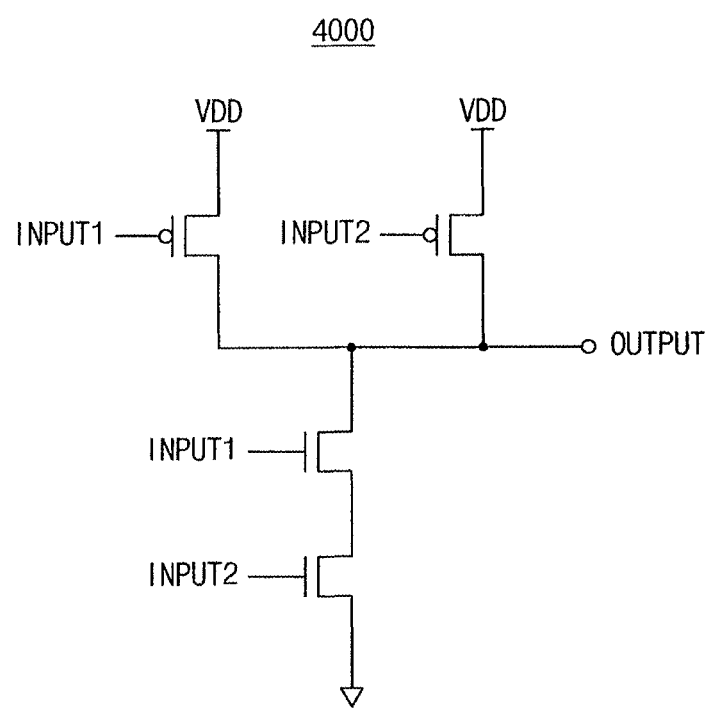
FIG. 13 illustrates a circuit diagram of a CMOS NAND device including semiconductor devices in accordance with example embodiments.

FIG. 13 is a circuit diagram illustrating a CMOS NAND device including semiconductor devices in accordance with example embodiments.

Referring to FIG. 13, the CMOS NAND device 4000 may include a pair of CMOS transistors to which different signals may be applied. The PMOS transistor and the NMOS transistor of the CMOS transistor may include the example embodiments of the finFETs described with reference to FIGS. 1, 2A and 2B.

Thus, the CMOS NAND device 4000 may be sufficiently downsized without any increase of the contact resistance between the contact structure and the semiconductor junction of the source/drain regions in the finFET, thereby increasing the memory capacity of the CMOS NAND device 4000 without deterioration of operation reliability.

Figure 14:
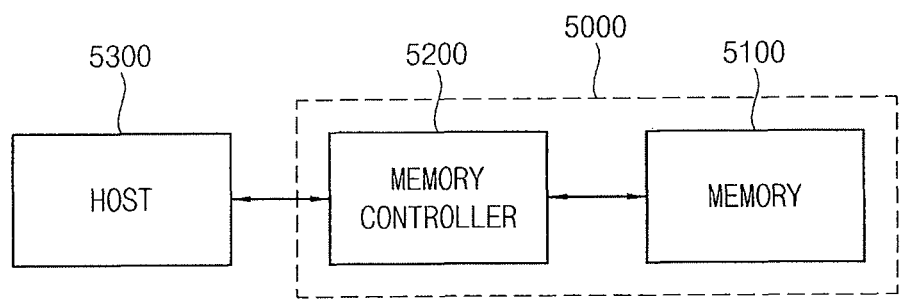
FIG. 14 illustrates a block diagram of a memory apparatus including semiconductor devices in accordance with an example embodiment.

FIG. 14 is a block diagram illustrating a memory apparatus including semiconductor devices in accordance with an example embodiment.

Referring to FIG. 14, the memory apparatus 5000 may include a memory unit 5100 and a memory controller 5200 controlling the operation of the memory unit 5100. The memory controller 5200 may control data reading from the memory unit 5100 and/or data storing to the memory unit 5100 in response to a host signal from a host 5300.

The memory unit 5100 and the memory controller 5200 may include the finFETs described in detail with reference to FIGS. 1, 2A and 2B.

Thus, void defects of the contact structure and the increase of the contact resistance between the contact structure and the semiconductor junction of the source/drain regions of the finFET may be sufficiently prevented or minimized when the finFET are downsized and thus the widths of the gate line and the contact structure may decrease. Therefore, the memory apparatus 5000 may be downsized with high memory capacity without any deterioration of the operational reliability.

Figure 15:
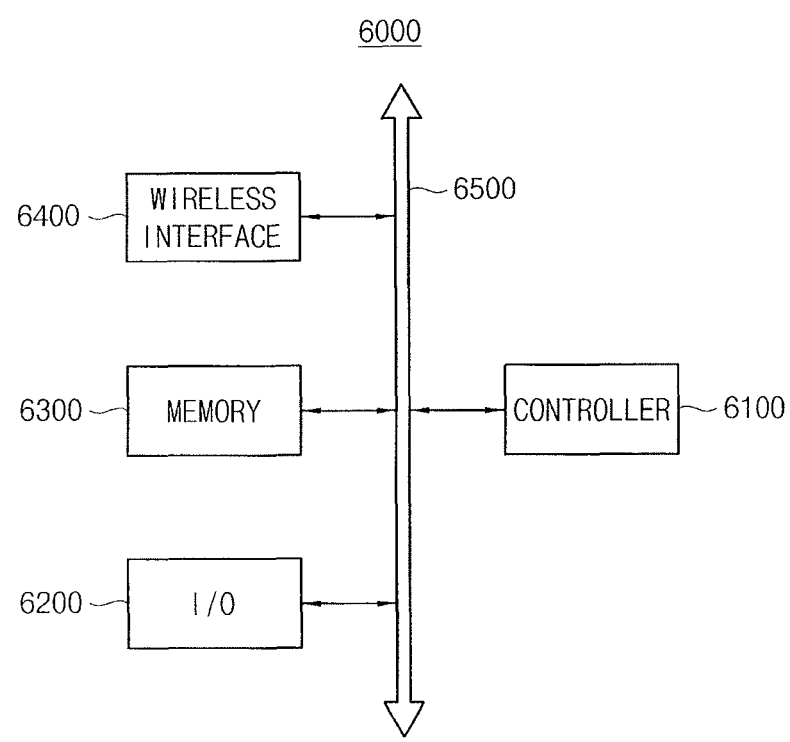
FIG. 15 illustrates a block diagram of an electronic system having semiconductor devices in accordance with example embodiments.

FIG. 15 is a block diagram illustrating an electronic system having semiconductor devices in accordance with example embodiments.

Referring to FIG. 15, the electronic system 6000 may include a controller 6100, an input/output (I/O) unit 6200, a memory unit 6300, and a wireless interface 6400 that may be electrically interconnected with one another via a bus line 6500.

The controller 6100 may include any one of a microprocessor, a digital signal processor and the like. The I/O unit 6200 may include a keypad, a keyboard and a display device.

The memory unit 6300 may store the instructions executed by the controller 6100 and the user data processed by the controller 6100.

The electronic system 6000 may transfer and receive data in a wireless communication network by using the wireless interface 6400. The wireless interface 6400 may include an antenna and/or wireless transceiver.

The electronic system 6000 may include a wireless communication system or a wireless data communicator having a third generation communication interface protocol such as a code division multiple access (CDMA), a global system for mobile communications (GSM), a North America digital cellular communications (NADC), an extended-time division multiple access (E-TDMA) and a wide band code division multiple access (WCDMA).

The electronic system 6000 may include the finFETs described with reference to FIGS. 1, 2A and 2C. Thus, the void defects of the contact structure and the increase of the contact resistance between the contact structure and the source/drain region of the finFET may be sufficiently prevented or minimized when the finFET may be downsized and thus the widths of the gate line and the contact structure may decrease in at least one of the controller 6100, the input/output (I/O) unit 6200, the memory unit 6300 and the wireless interface 6400, thereby downsizing the electronic system 6000 without any deterioration of the operational reliability.

By way of summation and review, reduction of the critical dimension of the semiconductor devices causes space reduction between neighboring gate electrodes, and as a result, the size of the contact hole is also reduced between the neighboring gate electrodes. The size reduction of the contact hole causes an increase of the aspect ratio of the contact hole, and the high aspect ratio of the contact hole causes various defects, e.g., void defects, in a subsequent filling process for filling up the contact hole.

Therefore, according to the example embodiments, a lower portion of the contact hole may be completely filled up with the barrier pattern, while an upper portion of the contact hole may be filled up with the contact pattern. As such, the lower portion of the contact hole may be sufficiently filled up without any void defects in spite of the high aspect ratio of the contact hole due to the high gap-fill characteristics of the barrier pattern. Thus, the contact resistance of the contact structure may not be deteriorated in spite of the size reduction of the semiconductor device.

That is, the lower portion of the contact hole may be filled with the lower barrier to the barrier height, so that the contact pattern may be filled only in the upper portion of the contact hole defined, e.g., and surrounded, by the barrier pattern. Thus, the area of the contact hole that is to be filled with the conductive material may be reduced, and the void defects may be sufficiently prevented in the contact hole. When the line width of the gate line decrease to below about 10 nm, and the width of the contact structure is also reduced, void defects in the contact hole may be sufficiently prevented by only controlling the etching conditions for forming the contact hole and the deposition conditions for forming the barrier pattern in the contact hole in spite of the high aspect ratio of the contact hole. Therefore, the finFET may have sufficiently good operation stability and reliability even though the gate line of the finFET may have a line width under about 10 nm.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate with lower structures;
   an insulation layer covering the lower structures on the substrate, a contact hole through the insulation layer partially exposing the substrate; and
   a contact structure contacting the substrate through the contact hole, the contact structure including:
     a barrier pattern having an upper barrier on an upper portion of a sidewall of the contact hole, and a lower barrier filling a lower portion of the contact hole, and
     a conductive contact pattern filling an upper portion of the contact hole, a volume of the conductive contact pattern inside the contact hole being smaller than a volume of the barrier pattern inside the contact hole,
   wherein the upper barrier has a thickness of 0.5 nm to 2 nm, and the lower barrier has a height of ½ to ⅔ times a height of the contact structure.

2. The semiconductor device as claimed in claim 1, wherein the barrier pattern includes at least one of a barrier metal and a metal nitride, and the conductive contact pattern includes a conductive metal.

3. The semiconductor device as claimed in claim 2, wherein the barrier pattern includes at least one of tantalum (Ta), titanium (Ti), molybdenum (Mo), ruthenium (Ru), cobalt (Co), tungsten (W), titanium nitride (TiN), tantalum nitride (TaN), tungsten nitride (WN) and combinations thereof, and the conductive contact pattern includes at least one of tantalum (Ta), titanium (Ti), molybdenum (Mo), ruthenium (Ru), cobalt (Co), tungsten (W) and combinations thereof.

4. The semiconductor device as claimed in claim 3, wherein the conductive contact pattern includes a crystal nucleus metal pattern.

5. The semiconductor device as claimed in claim 1, wherein the contact structure has a reverse trapezoidal shape having an upper width greater than a lower width.

6. The semiconductor device as claimed in claim 5, wherein the lower width is in a range of 5 nm to 10 nm, and the upper width is in a range of 14 nm to 20 nm.

7. A semiconductor device, comprising:
   at least one active fin extending in a first direction on a semiconductor substrate;
   at least one gate line crossing the active fin in a second direction;
   semiconductor junctions on the active fin around the gate line;
   an insulation interlayer pattern covering the gate line and having at least one contact hole therethrough, at least a portion of the semiconductor junctions being exposed through the at least one contact hole; and
   a contact structure contacting the exposed portion of the semiconductor junction through the contact hole, the contact structure including:
     a barrier pattern having an upper barrier on an upper portion of a sidewall of the contact hole, and a lower barrier filling a lower portion of the contact hole, a thickness of the lower barrier between top and bottom surfaces being larger than a thickness of the upper barrier between opposite lateral surfaces, and
     a conductive contact pattern filling an upper portion of the contact hole defined by the upper barrier and the lower barrier,
   wherein the contact structure has a reverse trapezoidal shape having an upper width of 14 nm to 20 nm and a lower width of 5 nm to 10 nm,
   wherein the at least one gate line includes:
     a gate insulation pattern extending in the second direction and covering top and side surfaces of the at least one active fin and a surface of the semiconductor substrate between the at least one active fin and a neighboring active fin,
     a gate conductive pattern arranged on the gate insulation pattern and having a predetermined thickness filling a gap space between the at least one active fin and the neighboring active fin, and
     a gate capping pattern arranged on the gate conductive pattern and having an upper surface coplanar with an upper surface of the insulation interlayer pattern.

8. The semiconductor device as claimed in claim 7, wherein the at least one gate line has a line width of 5 nm to 10 nm.

9. The semiconductor device as claimed in claim 8 wherein the lower barrier has a height of ½ to ⅔ times a height of the contact structure.

10. The semiconductor device as claimed in claim 9, wherein the height of the lower barrier is in a range of 20 nm to 50 nm, and the contact structure has a height of 40 nm to 100 nm.

11. The semiconductor device as claimed in claim 7, wherein the conductive contact pattern includes a crystal nucleus tungsten (W) pattern.

* * * * *